United States Patent
Ohtani et al.

(10) Patent No.: US 7,226,823 B2
(45) Date of Patent: *Jun. 5, 2007

(54) SEMICONDUCTOR DEVICE AND METHOD OF MANUFACTURING THE SAME

(75) Inventors: Hisashi Ohtani, Atsugi (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/195,654

(22) Filed: Aug. 3, 2005

(65) Prior Publication Data

US 2005/0277233 A1 Dec. 15, 2005

Related U.S. Application Data

(62) Division of application No. 09/226,216, filed on Jan. 7, 1999, now Pat. No. 6,939,755.

(30) Foreign Application Priority Data

Jan. 12, 1998 (JP) .................................. 10-018096

(51) Int. Cl.
*H01L 21/00* (2006.01)
(52) U.S. Cl. .................... 438/162; 438/308; 438/149; 438/151
(58) Field of Classification Search ............... 438/149, 438/151, 162, 308, 471, 476
See application file for complete search history.

(56) References Cited

U.S. PATENT DOCUMENTS

| 5,091,334 A | 2/1992 | Yamazaki et al. |
| 5,424,244 A | 6/1995 | Zhang et al. |
| 5,605,846 A * | 2/1997 | Ohtani et al. ............... 438/487 |
| 5,700,333 A | 12/1997 | Yamazaki et al. |
| 5,828,084 A | 10/1998 | Noguchi et al. |
| 5,830,784 A | 11/1998 | Zhang et al. |
| 5,837,619 A | 11/1998 | Adachi et al. |
| 5,840,590 A | 11/1998 | Myers, Jr. et al. |
| 5,859,443 A | 1/1999 | Yamazaki et al. |
| 5,864,151 A | 1/1999 | Yamazaki et al. |
| 5,897,347 A | 4/1999 | Yamazaki et al. |

(Continued)

OTHER PUBLICATIONS

James W. Mayer, "Electronic Material Science: For Integrated Circuits in Si and GaAs," Macmillan Publishing Company, New York, 1990, pp. 176-179.

*Primary Examiner*—Hsien-Ming Lee
(74) *Attorney, Agent, or Firm*—Eric J. Robinson; Robinson Intellectual Property Law Office

(57) ABSTRACT

In a method of obtaining a crystalline silicon film having high crystallinity at a low temperature and for a short time by using a catalytic element and using both a heat treatment and irradiation of laser light, a catalytic element which does not require a gettering step is used as the catalytic element for facilitating crystallization, so that a semiconductor device having high characteristics and high productivity is obtained. Specifically, a coating film of an element in group 14, such as germanium, which is the same group of the periodic table as silicon is formed on an amorphous silicon film formed on a glass substrate, a heat treatment at 550° C. for 4 hours is carried out, and further, irradiation of laser light is carried out, so that a crystalline silicon film is obtained. In the above structure, the element in group 14, which does not have a bad influence on TFT characteristics even if the element is left in the silicon film, is used, so that the semiconductor device having high characteristics and high productivity can be obtained.

16 Claims, 6 Drawing Sheets

U.S. PATENT DOCUMENTS

| | | |
|---|---|---|
| 5,915,174 A | 6/1999 | Yamazaki et al. |
| 5,923,997 A | 7/1999 | Mitanaga et al. |
| 5,932,892 A | 8/1999 | Hseuh et al. |
| 5,932,893 A | 8/1999 | Miyanaga et al. |
| 5,953,597 A | 9/1999 | Kusumoto et al. |
| 5,961,743 A | 10/1999 | Yamazaki et al. |
| 5,962,871 A | 10/1999 | Zhang et al. |
| 5,977,559 A | 11/1999 | Zhang et al. |
| 5,986,632 A | 11/1999 | Takayama et al. |
| 6,087,679 A | 7/2000 | Yamazaki |
| 6,121,076 A | 9/2000 | Zhang et al. |
| 6,144,426 A | 11/2000 | Yamazaki et al. |
| 6,165,824 A | 12/2000 | Takano |
| 6,388,270 B1 | 5/2002 | Yamazaki |
| 6,444,390 B1 | 9/2002 | Yamazaki |
| 6,472,684 B1 * | 10/2002 | Yamazaki et al. ............ 257/72 |
| 6,475,840 B1 | 11/2002 | Miyanaga |
| 6,479,333 B1 | 11/2002 | Takano |
| 6,482,684 B1 | 11/2002 | Yamazaki |
| 6,939,755 B1 * | 9/2005 | Ohtani et al. ................ 438/166 |

* cited by examiner

SEMICONDUCTOR DEVICE AND METHOD OF MANUFACTURING THE SAME

BACKGROUND OF THE INVENTION

1. Field of the Invention

The present invention relates to a semiconductor device using a semiconductor having crystallinity and a method of manufacturing the same.

2. Description of the Related Art

A thin film transistor (hereinafter referred to as a TFT) using a thin film semiconductor is known. This TFT is constructed in such a manner that a thin film semiconductor is formed on a substrate and this thin film semiconductor is used. Although this TFT is used for various kinds of integrated circuits, the TFT receives attention especially as a component of an electrooptical device, especially as a switching element provided in each pixel and a driver element formed in a peripheral circuit portion of an active matrix type liquid crystal display device.

As a thin film semiconductor used for the TFT, although it is easy to use an amorphous silicon film, there is a problem that its electrical characteristics are low. For the purpose of obtaining the improvement in the characteristics of the TFT, it is appropriate that a silicon thin film having crystallinity is used. A silicon film having crystallinity is referred to as polycrystalline silicon, polysilicon, microcrystalline silicon, or the like. In order to obtain the silicon film having the crystallinity, it is appropriate that an amorphous silicon film is first formed, and then, the film is crystallized by heating.

However, in crystallization by heating, it is necessary to carry out heating at a temperature of 600° C. or higher and for 10 hours or more, so that there is a problem that it is difficult to use a glass substrate as a substrate. For example, Corning 7059 glass used for an active type liquid crystal display device has a glass distortion point of 593° C., and there is a problem in heating at a temperature of 600° C. or higher when enlarging the area of a substrate is taken into consideration.

According to the study of the present inventors, it has been found that if heating is carried out after a very small amount of element, such as nickel or palladium, is deposited on the surface of an amorphous silicon film, the amorphous film can be crystallized at a temperature of 550° C. for a processing time of about 4 hours. However, if a large amount of elements as set forth above exist in the semiconductor, the reliability or electrical stability of a device using such semiconductor is damaged, and this is not preferable.

That is, although an element for facilitating crystallization, such as nickel, (in this specification, an element for facilitating crystallization will be referred to as a catalytic element) is necessary when an amorphous silicon film is crystallized, it is desirable not to make the element contained in crystallized silicon to the utmost. Although various methods for gettering the catalytic element in crystallized silicon have been investigated to achieve this object, any method increases the number of steps for gettering and is not very preferable in manufacturing a component.

Although it has been found that when the catalytic element is introduced, crystallization can be made at a temperature of 600° C. or lower for a short time, the crystallinity obtained by the heat treatment has a limit, and there occurs a problem that the crystallinity becomes insufficient.

SUMMARY OF THE INVENTION

An object of the present invention is, in manufacture of a thin film silicon semiconductor having crystallinity by a heat treatment at a temperature of 600° C. or lower using a catalytic element, to satisfy the requests of (1) obtaining a method with high productivity by decreasing the number of steps, and (2) obtaining crystallinity higher than that obtained by the heat treatment.

According to the present invention, in order to achieve the above object, the following means are used so that a silicon film having crystallinity is obtained.

A heat treatment is carried out while a simple substance of a catalytic element for facilitating crystallization of an amorphous silicon film or a compound containing the catalytic element is made to be retained on the amorphous silicon film, so that a part or all of the amorphous silicon film is crystallized. Then, the film is irradiated with laser light or intense light so that crystallization is further promoted. A kind of or plural kinds of elements selected from group 14 of the periodic table are used as the above catalytic element.

Especially, the present invention has a feature that a kind of or plural kinds of elements selected from group 14 which is the same as the group of the periodic table to which silicon of semiconductor material belongs, are used as the catalytic element. That is, when the element in group 14 is used as the catalytic element, a gettering step becomes unnecessary. This is because, in general, elements which belong to the same group have similar properties to each other, and even if the catalytic element in group 14 remains in a silicon film in group 14, deterioration of semiconductor characteristics does not occur. That the characteristics are not deteriorated is obvious also from the fact that a group 14—group 14 alloy semiconductor, such as SiGe or SiSn, is known as a compound alloy semiconductor.

It is preferable to use a kind of or plural kinds of elements selected from germanium, tin, and lead as the catalytic element. Although carbon, germanium, tin and lead are known as elements in group 14 other than silicon, among the elements, each of germanium, tin, and lead has electronegativity similar to that of silicon, and those elements are mixed at random. Thus, when those elements are used, the semiconductor characteristics are improved as compared with the case where carbon is used.

It is further preferable to use germanium as the catalytic element. Silicon and germanium are similar to each other in not only electronegativity but also covalent radius, and a random network of continuous and uniform composition is formed, so that the semiconductor characteristics are further improved as compared with the case where tin or lead is used.

Another feature of the present invention is that after a part or all of the amorphous silicon film is crystallized by carrying out the heat treatment, the film is irradiated with laser light or intense light to further promote crystallization. By this method, a crystalline silicon film having extremely excellent crystallinity can be obtained through a method with high productivity.

By carrying out the irradiation of laser light after the heat treatment, the crystallinity of the silicon film crystallized by the heat treatment can be further improved. In the case where crystallization is partially caused by the heat treatment, the crystal growth is further progressed from the portion which is irradiated with laser light so that the state of higher crystallinity can be realized.

For example, in the case where an introduction amount of catalytic element is small, crystallization occurs in minute scattered regions. This state can be said a state in which crystalline constituents and amorphous constituents are mixed with each other on the whole. Here, by irradiation of laser light, crystal growth can be made from crystal nuclei existing in the constituents having crystallinity, so that the silicon film having high crystallinity can be obtained. That is, a small crystal grain can be grown into a large crystal grain. Like this, the effect of promoting crystallinity by irradiation of laser light becomes notable especially in the case of a silicon film where crystallization is incomplete.

Instead of irradiating laser light, a method of irradiation of intense light, especially infrared light may be adopted. Since infrared light is not easily absorbed by glass, but is easily absorbed by a silicon thin film, it can selectively heat a silicon thin film formed on a glass substrate and is useful. This method of using infrared light is called rapid thermal annealing (RTA) or rapid thermal process (RTP).

Like this, a kind of or plural kinds of elements selected from elements in group 14, preferably a kind of or plural kinds of elements selected from germanium, tin, and lead, more preferably, germanium is made to be retained on an amorphous silicon film, and a heat treatment is carried out, and then, the film is irradiated with laser light or intense light, so that a crystalline silicon film having excellent crystallinity can be obtained. In the characteristics of a semiconductor using this crystalline silicon film, an increase or unevenness of off current is not seen, and a device having excellent characteristics can be obtained even if the catalytic element is not gettered.

Moreover, the present invention has a feature that an active region of a semiconductor device having at least one of PN, PI, NI and other electric junctions is formed by using a crystallized crystalline silicon film. As the semiconductor device, a thin film transistor (TFT), a diode, and a photosensor can be used.

By adopting the structure of the present invention, the basic effects described below can be obtained.

(a) A crystalline silicon film having excellent crystallinity can be obtained without requiring a high temperature process.

(b) It is not necessary to getter a catalytic element, so that device manufacturing steps can be greatly reduced.

(c) Since a catalytic element may remain in a silicon film, it is not necessary to precisely control the amount of introduction of the catalytic element.

(d) Since crystallization is further promoted by irradiation of laser light or intense light, a crystalline silicon film having extremely excellent crystallinity can be obtained.

As a method of introducing a catalytic element for facilitating crystallization, a plasma treatment, a vapor phase method such as an ion implantation method, a solid phase method, or a solution applying method is used. The solid phase method is a method in which a film containing a catalytic element is formed by using a plasma CVD method, an LPCVD method, a PVD method, or the like, and annealing is carried out to diffuse the catalytic element so that the catalytic element is introduced. The solution applying method is a method of applying a solution in which a simple substance of a catalytic element or a compound containing a catalytic element is dissolved or dispersed. For example, in the case where germanium is used as the catalytic element, as the compound containing the catalytic element, it is possible to use germanium bromide, germanium chloride, germanium iodide, germanium oxide, germanium sulphide, germane, germane acetate, tris (2,4-pentanedionate) germanium perchlorate, tetramethylgermane, tetraethylgermane, tetraphenylgermane, hexaethyl germanium, or the like.

In a method of applying a solution containing an element for facilitating crystallization to an amorphous silicon film, it is possible to use an aqueous solution, an organic solvent solution, or the like as the solution. Here, the term "containing" means both cases that the element is contained as a compound and the element is contained merely by dispersion.

As the solvent containing the catalytic element, it is possible to use one selected from the group consisting of polar solvents of water, alcohol, acid, and ammonium, and non-polar solvents of benzene, toluene, xylene, carbon tetrachloride, chloroform, and ether.

It is also effective to add a surfactant in the solution containing the catalytic element. This is for increasing adhesiveness to a coated surface and controlling adsorption. The surfactant may be applied to the coated surface in advance.

In the case where a simple substance of germanium is used as the catalytic element, it is necessary to dissolve the substance in an acid to form a solution.

Although the above are examples using a solution in which the catalytic element is completely dissolved, even if the catalytic element is not completely dissolved, it is also possible to use a material like emulsion in which a simple substance of the catalytic element or powder made of a compound containing the catalytic element is uniformly dispersed in a dispersion medium. Alternatively, a solution for forming an oxide film may be used. As such a solution, it is possible to use OCD (Ohka Diffusion Source) made by Tokyo Ohka Kogyo Corp. If this OCD solution is used, a silicon oxide film can be easily formed by applying it onto the formed surface and baking at about 200° C. Moreover, since impurities can be freely added, the solution can be used for the present invention.

When the catalytic element is selectively retained, crystal growth can be selectively carried out. Especially in this case, it is possible to cause crystal growth in the direction almost parallel to the surface of a silicon film from the region where the catalytic element has been retained to the region where the catalytic element has not been retained. This crystal growth in the direction almost parallel to the surface of a silicon film will be referred to as lateral growth in this specification.

If a device is manufactured in such a way that the direction of crystal grain boundaries in the lateral growth is almost coincident with the moving direction of carriers, an active layer region of the semiconductor device along the moving direction of carriers becomes a region where grain boundaries hardly exist or a region where uniform grain boundaries exist, so that the mobility of carriers is improved, dispersion among components disappears, and reliability of the device increases. Thus, it is effective in device manufacture to form an active layer region of a semiconductor device by using the region where crystal growth has been made in the lateral direction.

DETAILED DESCRIPTION OF THE PREFERRED EMBODIMENTS

Preferred embodiments of the present invention will be described below with reference to the drawings.

[Embodiment 1]

This embodiment shows an example in which a TFT is obtained by using a crystalline silicon film which is manufactured by retaining a catalytic element in group 14 for facilitating crystallization on an amorphous silicon film, crystallizing the amorphous film by heating, and further improving the crystallinity of the film by irradiation of laser light. The TFT of this embodiment can be used for a driver circuit and a pixel portion of an active matrix type liquid crystal display device. It is needless to say that an applied scope of the TFT is not limited to the liquid crystal display device but the TFT can be applied to a common thin film integrated circuit.

FIGS. 1A to 1E schematically show manufacturing steps of this embodiment. In this embodiment, Corning 7059 glass is used for a glass substrate 301. First, a silicon oxide film 302 as an under film with a thickness of 200 nm is formed on the glass substrate 301. This silicon oxide film 302 is provided to prevent impurities from diffusing from the glass substrate.

Then an amorphous silicon film 3030 with a thickness of 10 to 150 nm is formed by a plasma CVD method or an LPCVD method. Here, the amorphous silicon film with a thickness of 50 nm is formed by the LPCVD method.

Figure 1A:
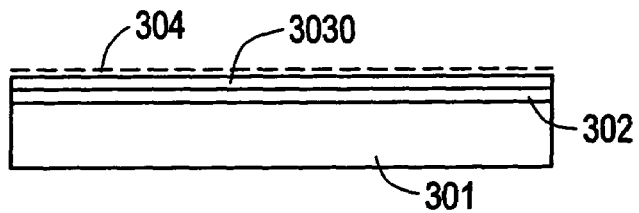
FIGS. 1A to 1E are views showing manufacturing steps according to an embodiment.

Then a germanium film 304 with a thickness of 5 to 100 nm, preferably 10 to 50 nm is formed by the LPCVD method using $GeH_4$ as a raw material (FIG. 1A). Then a heat treatment in a heating furnace is carried out in a nitrogen atmosphere at 550° C. for 4 hours. As a result, it is possible to obtain a crystalline silicon thin film 3031 formed on the substrate 301.

Although the above heat treatment can be carried out at a temperature of 450° C. or higher, if the temperature is low, a heating time must be prolonged, so that production efficiency is lowered. On the other hand, if the temperature is made 600° C. or higher, a problem of heat resistance of the glass substrate used as the substrate occurs.

Figure 1B:
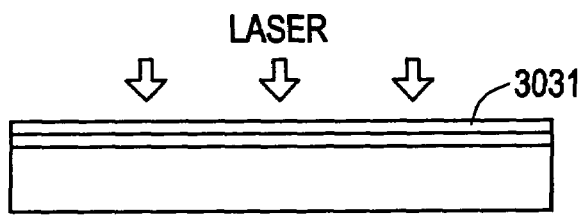
Figure 1C:

By carrying out the above heat treatment, the silicon film in which an amorphous constituent and crystal constituent are mixed is obtained. The crystal constituent is a region where crystal nuclei exist. Thereafter, the germanium film is removed, and the silicon film 3031 is irradiated with several shots of a KrF excimer laser (wavelength 248 nm, pulse width 30 nsec) in a nitrogen atmosphere at a power density of 200 to 350 $mJ/cm^2$, so that the crystallinity of the silicon film 3031 is promoted. In the irradiation step of the laser light, the substrate may be heated up to about 400° C. By this step, crystal growth is made using crystal nuclei existing in the crystal constituent as nuclei. This step may be carried out by the foregoing irradiation of infrared light (FIG. 1B). Next, the crystallized silicon film is patterned to form an island-like region 3032. This island-like region 3032 forms an active layer of the TFT. Then a silicon oxide film 305 with a thickness of 20 to 150 nm, here 100 nm is formed. This silicon oxide film functions also as a gate insulating film (FIG. 1C).

Care must be paid to the manufacture of the above silicon oxide film 305. Here, TEOS was used as a raw material, and was decomposed and deposited, together with oxygen, by an RF plasma CVD method at a substrate temperature of 150 to 600° C., preferably 300 to 450° C. A pressure ratio of TEOS to oxygen was made 1:1 to 1:3, the pressure was made 0.05 to 0.5 torr, and the RF power was made 100 to 250 W. Alternatively, the silicon oxide film was formed by a low pressure CVD method or an atmospheric pressure CVD method using TEOS, together with an ozone gas, as a raw material at a substrate temperature of 350 to 600° C., preferably 400 to 550° C.

In this state, the crystallization of the silicon region 3032 may be promoted by irradiation of KrF excimer laser light (wavelength 248 nm, pulse width 20 nsec) or intense light comparable to the laser light. Especially, RTA (Rapid Thermal Annealing) using infrared light can selectively heat only silicon without heating a glass substrate, and can decrease interfacial levels at an interface between silicon and silicon oxide film, so that it is useful in manufacture of an insulated gate type field effect semiconductor device.

Figure 1D:
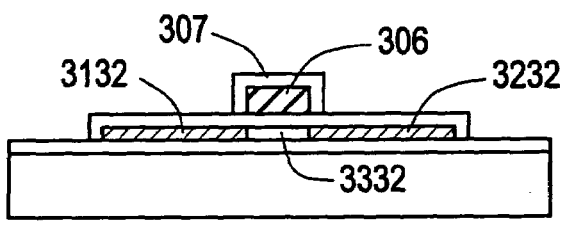

Thereafter, a film having a thickness of 200 nm to 1 μm and containing aluminum as its main ingredient is formed by an electron beam evaporation method, and this film is patterned to form a gate electrode 306. The film containing aluminum as its main ingredient may be doped with scandium (Sc) of 0.15 to 0.2 wt %. Next, the substrate is immersed in an ethylene glycol solution containing tartaric acid of 1 to 3% and having pH≈7, and anodic oxidation is carried out while using platinum as a cathode and the gate electrode of aluminum as an anode. The anodic oxidation is carried out in such a manner that voltage is first raised up to 220 V at a constant current, this state is held for 1 hour, and the oxidation is ended. In this embodiment, in a constant current state, it is appropriate that a rising speed of voltage is 2 to 5 V/min. In this way, an anodic oxide 307 with a thickness of 150 to 350 nm, for example, 200 nm is formed (FIG. 1D). The anodic oxide has a function to electrically and mechanically protect the surface of the film mainly containing aluminum which has low heat resistance. In this embodiment, although aluminum covered with anodic oxide is used for the gate electrode, silicon or silicide having superior heat resistance may be used.

Thereafter, by an ion doping method (also called a plasma doping method), an impurity (phosphorus) is implanted in the island-like silicon film of each TFT by using the gate electrode portion as a mask in a self-aligning manner. Phosphine ($PH_3$) is used as a doping gas. The dosage is made 1 to $4 \times 10^{15}$ $cm^{-2}$. Further, by irradiation of KrF excimer laser light (wavelength 248 nm, pulse width 20 nsec), crystallinity of a portion where crystallinity was deteriorated by introduction of the above impurity is improved. The energy density of laser light is 150 to 400 $mJ/cm^2$, preferably 200 to 250 $mJ/cm^2$. In this way, N-type impurity (phosphorus) regions 3132 and 3232 are formed. The sheet resistance of these regions was 200 to 800 Ω/□. In this step, so-called intense light comparable to the laser light, such as in the RTA, may be used instead of using the laser light.

Thereafter, as an interlayer insulator 308, a silicon oxide film with a thickness of 300 nm is formed on the whole surface by using TEOS as a raw material and by a plasma CVD method using TEOS and oxygen, or a low pressure CVD method or atmospheric CVD method using TEOS and ozone. The substrate temperature is made 250 to 450° C., for example, 350° C.

Figure 1E:
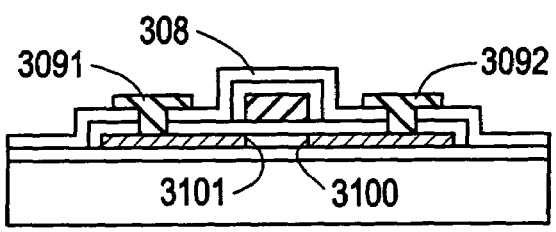

Then the interlayer insulator 308 is etched to form contact holes in source/drain of the TFT, as shown in FIG. 1E, and source/drain electrodes/wiring lines 3091 and 3092 made of aluminum or multilayer films of titanium nitride and aluminum are formed.

Finally, annealing in hydrogen is carried out at 300 to 400° C. for 1 to 2 hours, so that hydrogenating of silicon is completed. In this way, the TFT is completed. A plurality of TFTs manufactured at the same time are arranged in matrix, so that an active matrix type liquid crystal display device is completed. This TFT includes the source/drain regions 3132/3232 and a channel formation region 3332. Portions 3100 and 3101 become electrical junction portions of NI.

In the TFT manufactured in this embodiment, by using the catalytic element in group 14, a mobility of not less than 150 cm$^2$/Vs can be obtained for an N-channel TFT without a gettering step. It is also ascertained that Vth is low and the TFT has excellent characteristics. Moreover, it is also ascertained that the dispersion of mobility is within ±10%. It is conceivable that the low dispersion is due to the incomplete crystallization by the heat treatment and the step of promoting the crystallinity by the irradiation of laser light. Although a TFT having a mobility of not less than 150 cm$^2$/Vs for an N-channel TFT can be easily obtained in the case where only laser light is used, the dispersion is high and uniformity as in this embodiment can not be obtained.

In this embodiment, although a method of introducing a catalytic element onto an amorphous silicon film has been described, a method of introducing the catalytic element into a portion under the amorphous silicon film may be adopted. In that case, it is appropriate that after a film containing the catalytic element is formed, the amorphous silicon film is formed. The method of introducing the catalytic element is not limited to the LPCVD method, but another solid phase method, vapor phase method, solution applying method, or the like may be used.

[Embodiment 2]

This embodiment shows an example in which a TFT is obtained by using a crystalline silicon film which is manufactured by retaining a catalytic element in group 14 for facilitating crystallization on an amorphous silicon film by using a solution applying method, crystallizing the amorphous film by heating, and further improving the crystallinity of the film by irradiation of laser light. The TFT of this embodiment can be used for a driver circuit and a pixel portion of an active matrix type liquid crystal display device. It is needless to say that an applied scope of the TFT is not limited to the liquid crystal display device, but the TFT can be applied to a common thin film integrated circuit.

FIGS. 2A to 2E schematically show manufacturing steps of this embodiment. First, a silicon oxide film 402 as an under film with a thickness of 200 nm is formed on a glass substrate 401 (Corning 7059). This silicon oxide film is provided to prevent impurities from diffusing from the glass substrate. Further, an amorphous silicon film 4030 with a thickness of 20 to 150 nm, here, 50 nm is formed by a plasma CVD method.

After a hydrofluoric acid treatment for removing a natural oxide film is carried out, a thin oxide film with a thickness of about 2 nm is formed by irradiation of UV light in an oxygen atmosphere. The manufacturing method of the thin oxide film may be a treatment with hydrogen peroxide or a method by thermal oxidation.

Then an acetate solution 404 containing germanium of 10 ppm (in weight) is applied (FIG. 2A), it is retained for 5 minutes, and spin drying is carried out by using a spinner. Thereafter, a crystallized silicon film 4031 is obtained by heating at 550° C. for 4 hours.

Figure 2A:
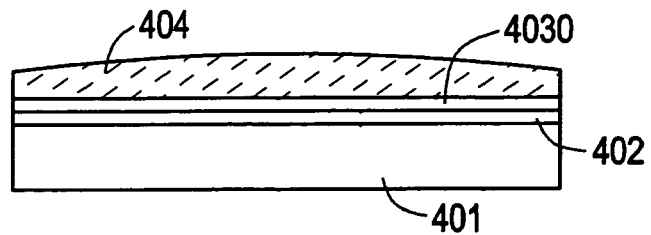
FIGS. 2A to 2E are views showing manufacturing steps according to an embodiment.
Figure 2B:
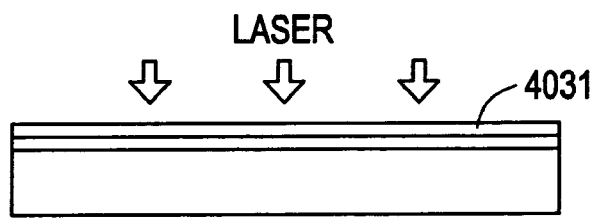

By carrying out the above heat treatment, a silicon film in which an amorphous constituent and a crystal constituent are mixed is obtained. The crystal constituent is a region where crystal nuclei exist. Thereafter, the germanium film is removed, and the silicon film is irradiated with KrF excimer laser light of 200 to 300 mJ/cm$^2$, so that the crystallinity of the silicon film is promoted. In the irradiation step of the laser light, the substrate may be heated up to about 400° C. By this step, crystal growth is made using crystal nuclei existing in the crystal constituent as nuclei (FIG. 2B).

Figure 2C:

Next, the crystallized silicon film 4031 is patterned to form an island-like region 4032. This island-like region 4032 forms an active layer of the TFT. Then a silicon oxide film 405 with a thickness of 100 nm is formed. This silicon oxide film functions also as a gate insulating film (FIG. 2C).

Subsequently, by a sputtering method, a film having a thickness of 300 to 800 nm, for example, 600 nm and containing aluminum as its main ingredient (containing scandium of 0.1 to 0.3 wt %) is deposited. Then, a gate electrode 406 is formed by a well-known photolithography method. Next, the substrate is immersed in an ethylene glycol solution (pH is adjusted to a neutral state by ammonia) of 3% tartaric acid, and a current is made to flow in the solution to raise a voltage up to 100 V at a rate of 1 to 5 V/min, for example, 4 V/min so that anodic oxidation is carried out. At this time, not only the top surface of the gate electrode but also the side of the gate electrode is subjected to anodic oxidation, and a dense nonporous anodic oxide 407 with a thickness of 100 nm is formed. The withstand voltage of this anodic oxide is 50 V or higher. In this embodiment, although aluminum covered with anodic oxide is used as the gate electrode, silicon or silicide having superior heat resistance may be used.

Figure 2D:
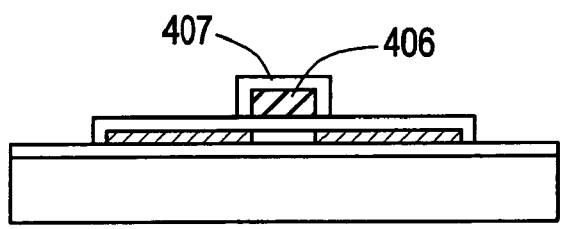

Next, by a plasma doping method, an impurity (phosphorus) is implanted in the island-like region 4032 of silicon by using the gate electrode as a mask. Phosphine (PH$_3$) is used as a doping gas, and the acceleration voltage is made 5 to 30 kV, for example, 10 kV. The dosage is made $1\times10^{14}$ to $8\times10^{15}$ cm$^{-2}$, for example, $2\times10^{15}$ cm$^{-2}$ (FIG. 2D).

Figure 2E:
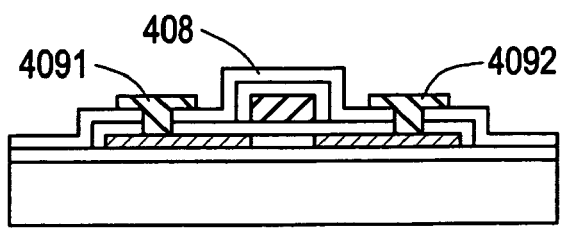

Thereafter, irradiation of laser light is carried out from the above, and laser annealing is carried out, so that the doped impurity is activated. Subsequently, a silicon oxide film 408 with a thickness of 600 nm is formed as an interlayer insulator by a plasma CVD method. Then an ITO electrode which becomes a pixel electrode is formed. Further, contact holes are formed, and electrode/wiring lines 4091 and 4092 of a source region and drain region of the TFT are formed out of a metallic material, for example, a multilayer film of titanium nitride and aluminum. Finally, annealing is carried out in a hydrogen atmosphere of 1 atmospheric pressure at 350° C. for 30 minutes. Through the above steps, the thin film transistor is completed (FIG. 2E).

In the TFT manufactured in this embodiment, by using the catalytic element in group 14, a mobility of not less than 150 cm$^2$/Vs can be obtained for an N-channel TFT without a gettering step. It is also ascertained that Vth is low and the TFT has excellent characteristics. Moreover, it is also ascertained that the dispersion of mobility is within ±10%. It is conceivable that the low dispersion is due to the incomplete crystallization by the heat treatment and the step of promoting the crystallinity by the irradiation of laser light. Although a TFT having a mobility of not less than 150 cm$^2$/Vs for an N-channel TFT can be easily obtained in the case where only laser light is used, the dispersion is high and uniformity as in this embodiment can not be obtained.

In this embodiment, although a method of introducing a catalytic element onto an amorphous silicon film, a method of introducing a catalytic element into a portion under the amorphous silicon film may be adopted. In that case, it is appropriate that after a film containing a catalytic element is formed, the amorphous silicon film is formed. A method of introducing a catalytic element is not limited to the solution applying method, but a solid phase method, a vapor phase method, a solution applying method using another solution, or the like may be used.

[Embodiment 3]

This embodiment shows an example in which germanium is selectively introduced, and an electronic device is formed by using a region where crystals grow in a lateral direction (direction parallel to a substrate) from a portion where germanium has been introduced. In the case where such a structure is adopted, the crystallinity in an active layer region of the device can be increased, so that it is possible to make a structure extremely desirable in view of electrical stability and reliability of the device.

FIGS. 3A to 3F show manufacturing steps of this embodiment. First, a substrate 201 (Corning 7059, 10 cm square) is washed, and an under film 202 of silicon oxide with a thickness of 200 nm is formed by using a raw material gas of TEOS (tetra ethoxy silane) and oxygen by plasma CVD. Then an amorphous silicon film 203 with a thickness of 50 to 150 nm, for example, 100 nm is formed. Next, a silicon oxide film 205 with a thickness of 50 to 200 nm, for example, 100 nm is subsequently formed by a plasma CVD method. Then the silicon oxide film 205 is selectively etched to form a region 206 where amorphous silicon is exposed.

Figure 3A:
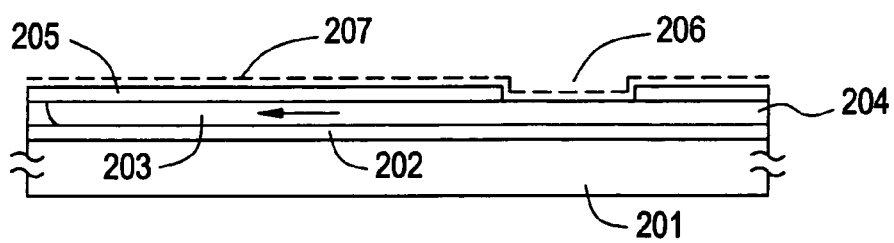
FIGS. 3A to 3F are views showing manufacturing steps according to an embodiment.

Then a germanium film with a thickness of 5 to 100 nm, preferably 10 to 50 nm is formed by an LPCVD method using $GeH_4$ as a raw material. Thereafter, heat annealing is carried out in a nitrogen atmosphere at 500 to 600° C., for example, 550° C. for 4 hours, so that the silicon film 203 is crystallized. The crystal growth progresses in the direction parallel to the substrate as indicated by an arrow from the region 206, where germanium is in contact with the silicon film, as a starting point. In the drawing, a region 204 is a portion which is crystallized through direct introduction of germanium and the region 203 indicates a portion which is crystallized in the lateral direction. The size of the crystal in the lateral direction indicated by 203 is about 25 to 100 μm. It is ascertained that the direction of crystal growth is roughly in a <111> axis direction (FIG. 3A).

After the crystallizing step by the above heat treatment, the crystallinity of the silicon film 203 is further promoted by irradiation of infrared light. This step is carried out by irradiation of infrared light with a peak at a wavelength of 0.6 to 4 μm, for example, 0.8 to 1.4 μm. By this step, it is possible to obtain effects comparable to those obtained by a high temperature heat treatment for several minutes.

A halogen lamp is used as a light source of infrared light. The intensity of infrared light is adjusted so that the temperature of a monitor of a single crystal silicon wafer is between 900 and 1200° C. Concretely, the temperature of a thermocouple buried in the silicon wafer is monitored, and the monitoring result is fed back to the light source of infrared light. In this embodiment, a temperature rise is constant and its rate is 50 to 200° C./second, and a temperature fall is natural cooling and its rate is 20 to 100° C./sec. Since this irradiation of infrared light selectively heats the silicon film, heating to the glass substrate can be suppressed to the minimum.

Next, the silicon oxide film 205 is removed. At this time, an oxide film formed on the surface of the region 206 is also removed at the same time. Then, after the silicon film 204 is patterned, dry etching is carried out, so that an island-like active layer region 208 is formed. At this time, the region denoted by 206 in FIG. 3A is a region where germanium is directly introduced, and germanium with a high concentration exists. It is ascertained that germanium with a high concentration exists also at the end of the crystal growth. Even if germanium with a high concentration exists in the silicon film, it does not affect the semiconductor characteristics. However, if the concentration of germanium in the active region is irregular, the characteristics of components become irregular, which is not preferable. Thus, this embodiment adopts such a structure that the region where the concentration of germanium is high in the active layer 208 does not overlap with a channel formation region.

Figure 3B:
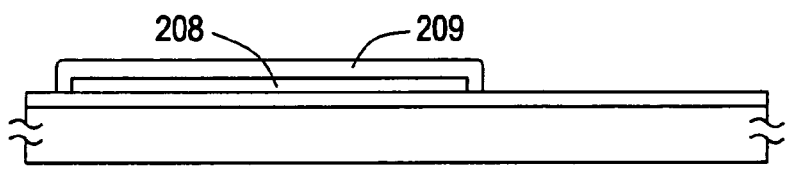

Thereafter, the active layer is left as it is for one hour in an atmosphere containing water vapor of 100 vol %, and having 10 atmospheric pressures and a temperature of 500 to 600° C., typically 550° C., so that the surface of the active layer (silicon film) 208 is oxidized to form a silicon oxide film 209. The thickness of the silicon oxide film is made 100 nm. After the silicon oxide film 209 is formed by thermal oxidation, the substrate is held in an ammonia atmosphere (1 atm., 100%) at 400° C. Then, the substrate in this state is irradiated with infrared light having a peak at a wavelength of 0.6 to 4 μm, for example, 0.8 to 1.4 μm for 30 to 180 seconds, and a nitriding treatment is applied to the silicon oxide film 209. At this time, HCl of 0.1 to 10% may be mixed in the atmosphere (FIG. 3B).

Figure 3C:
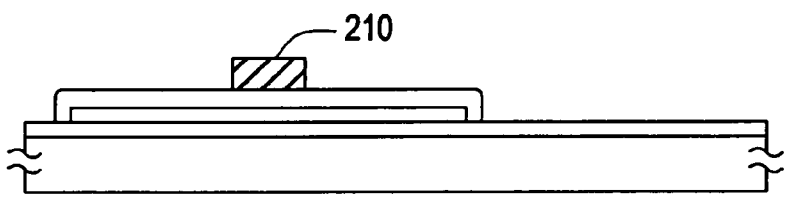

Subsequently, a film of aluminum (containing scandium of 0.01 to 0.2%) with a thickness of 300 to 800 nm, for example, 600 nm is formed by a sputtering method. Then, the aluminum film is patterned to form a gate electrode 210 (FIG. 3C).

Figure 3D:
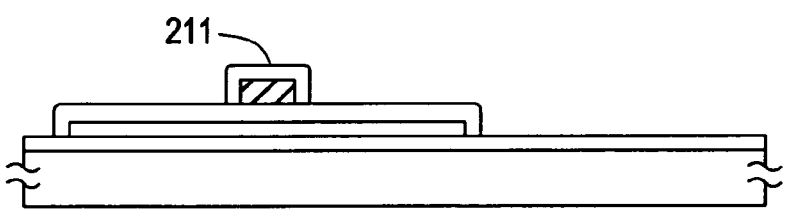

Further, the surface of the aluminum is subjected to anodic oxidation, so that an oxide layer 211 is formed on the surface. This anodic oxidation is carried out in an ethylene glycol solution containing tartaric acid of 1 to 5%. The thickness of the obtained oxide layer 211 is 200 nm. Incidentally, since the thickness of this oxide 211 becomes a thickness forming an offset gate region in a subsequent ion doping step, the length of the offset gate region can be determined by the above anodic oxidation step (FIG. 3D). Silicon or silicide superior to aluminum in heat resistance may be used as the gate electrode. In the case where the gate electrode is formed out of silicon or silicide, an offset gate region can be formed by ion doping after a side wall is provided on the gate electrode.

Next, by an ion doping method (also called a plasma doping method), an impurity (here, phosphorus) for giving N-type conductivity is added in the active layer region (constituting source/drain, and channel) by using a gate electrode portion, that is, the gate electrode 210 and the oxide layer 211 around the gate electrode as a mask in a self-aligning manner. Phosphine ($PH_3$) is used as a doping gas, and the acceleration voltage is made 60 to 90 kV, for example, 80 kV. The dosage is made $1 \times 10^{15}$ to $8 \times 10^{15}$ cm$^{-2}$, for example, $4 \times 10^{15}$ cm$^{-2}$. As a result, N-type impurity regions 212 and 213 can be formed. As is apparent from the drawing, the impurity regions and the gate electrode make an offset state in which each of the impurity regions is apart from the gate electrode at a distance of "x". Such an offset state is effective especially in lowering a leak current (also called an off current) when a reverse voltage (minus voltage in the case of an N-channel TFT) is applied to the gate electrode. Particularly, in the TFT for controlling a pixel of an active matrix as in this embodiment, for the purpose of obtaining an excellent picture image, it is desirable that the leak current is low so that an electric charge stored in a pixel electrode does not escape. Thus, it is effective to provide an offset.

Figure 3E:
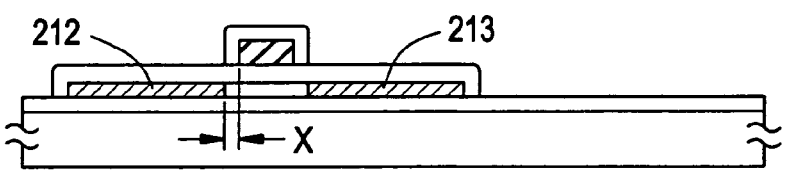

Thereafter, annealing is carried out by irradiation of laser light. For the laser light, although a KrF excimer laser (wavelength 248 nm, pulse width 20 nsec) is used, another laser may be used. The irradiation conditions of laser light are such that the energy density is 200 to 400 mJ/cm$^2$, for example, 250 mJ/cm$^2$, and irradiation of 2 to 10 shots for one place, for example, 2 shots are made. The effect may be increased by heating the substrate up to about 200 to 450° C. at the irradiation of the laser light (FIG. 3E).

Subsequently, a silicon oxide film 214 with a thickness of 600 nm as an interlayer insulator is formed by a plasma CVD method. Further, a transparent polyimide film 215 is formed by a spin coating method so that the surface is flattened.

Figure 3F:
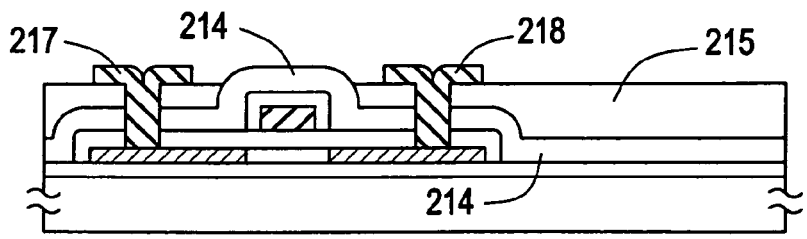

Then, contact holes are formed in the interlayer insulators 214 and 215, and electrode/wiring lines 217 and 218 of the TFT are formed out of a metallic material, for example, a multilayer film of titanium nitride and aluminum. Finally, annealing at 350° C. for 30 minutes is carried out in a hydrogen atmosphere of 1 atmospheric pressure, so that a pixel circuit of an active matrix including the TFT is completed (FIG. 3F).

The crystallinity of the active region of the TFT manufactured by this embodiment is excellent, so that the TFT can have a high mobility, and can be used for a driver circuit of an active matrix type liquid crystal display device.

Although germanium is used as the catalytic element in this embodiment, other elements in group 14 can also be used. Moreover, although the LPCVD method is used as the method of introducing germanium, even if a method, such as a solid phase method using another method, a vapor phase method, or a solution applying method, is used, similar effects can be obtained.

[Embodiment 4]

In this embodiment, the present invention is applied to a reverse stagger type TFT. FIGS. 4A to 4D are sectional views showing manufacturing steps of this embodiment. First, an under film (not shown) of silicon oxide with a thickness of 200 nm is formed on a substrate (Corning 7059) 101 by a sputtering method. Then a gate electrode 102 made of metal silicide is formed. Further, a gate insulating film 103 is formed.

Figure 4A:
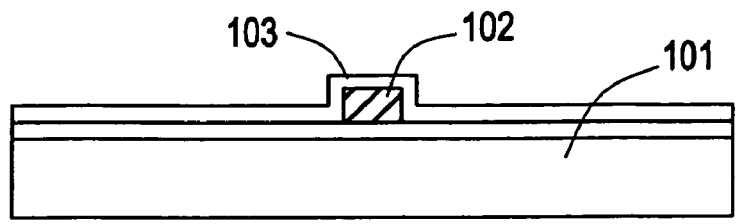
FIGS. 4A to 4D are views showing manufacturing steps according to an embodiment.
Figure 4B:
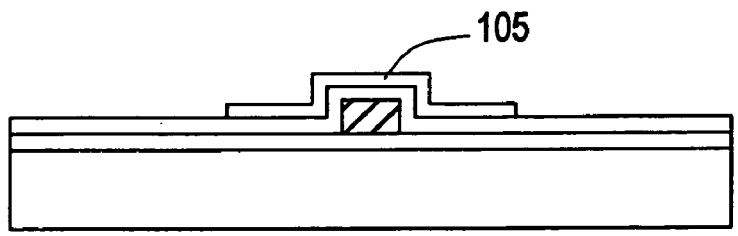

Next, an intrinsic (I-type) amorphous silicon film with a thickness of 50 to 150 nm, for example, 100 nm is formed by an LPCVD method. Then a germanium film with a thickness of 5 to 100 nm, preferably 10 to 50 nm is formed by the LPCVD method using GeH$_4$ as a raw material. The film is crystallized by annealing in a nitrogen atmosphere (atmospheric pressure) at 550° C. for 4 hours. After the germanium film is removed, crystallization is further promoted by irradiation of KrF excimer laser light. Then the silicon film is patterned to form an island-like silicon film (active layer of the TFT) 105 (FIG. 4B). Next, a mask 106 is provided, and an impurity (here, phosphorus) for giving N-type conductivity is added in an active layer region (constituting source/drain, and channel) by an ion doping method (also called a plasma doping method). Phosphine (PH$_3$) is used as a doping gas, and the acceleration voltage is made 60 to 90 kV, for example, 80 kV. The dosage is made $1 \times 10^{15}$ to $8 \times 10^{15}$ cm$^{-2}$, for example, $5 \times 10^{15}$ cm$^{-2}$. As a result, N-type impurity regions 107 and 108 are formed.

Figure 4C:
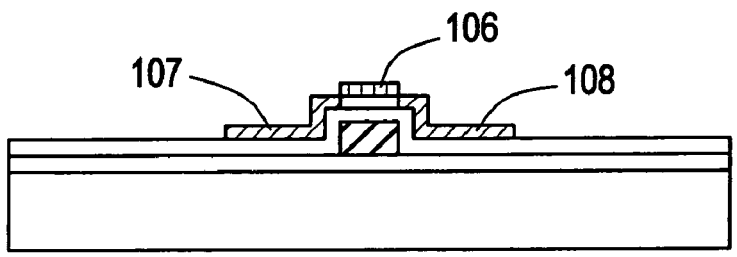

Thereafter, annealing is carried out by irradiation of laser light. Although a KrF excimer laser (wavelength 248 nm, pulse width 20 nsec) is used for the laser light, other lasers may be used. The irradiation conditions of laser light are such that the energy density is 200 to 400 mJ/cm$^2$, for example, 250 mJ/cm$^2$, and irradiation of 2 to 10 shots for one place, for example, 2 shots is carried out. The effect may be increased by heating the substrate up to about 200 to 450° C. at the irradiation of the laser light (FIG. 4C). This step may be a method by lamp annealing using near infrared light.

Figure 4D:
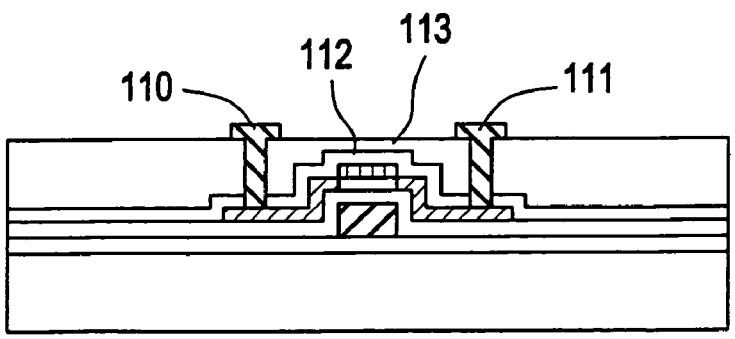

Next, as an interlayer insulating film, a silicon oxide film 112 and a polyimide film 113 are formed. Further, contact holes are formed, and metal wiring lines of TFT 110 and 111 are formed out of a metallic material, for example, a multilayer film of titanium nitride and aluminum. Finally, annealing is carried out in a hydrogen atmosphere of 1 atmospheric pressure at 350° C. for 30 minutes so that the reverse stagger type TFT is completed (FIG. 4D).

The mobility of the TFT obtained by the method described above was 110 to 150 cm$^2$/Vs, and the S value was 0.2 to 0.5 V/digit. A P-channel TFT was also manufactured by a similar method in which boron was doped in source/drain regions. The mobility of the p-channel TFT was 90 to 120 cm$^2$/Vs, and the S value was 0.4 to 0.6 V/digit. As compared with the case where a gate insulating film is formed by a well-known PVD method or CVD method, the mobility increased by 20 percents or more and the S value decreased by 20% or more.

Also in view of reliability, the TFT manufactured in this embodiment showed an excellent result comparable to a TFT manufactured by high temperature oxidation at 1,000° C.

In this embodiment, although germanium is used as the catalytic element, other elements in group 14 can also be used. Moreover, in this embodiment, although the LPCVD method is used as a method of introducing germanium, even if a method, such as a solid phase method using another method, a vapor phase method, or a solution applying method, is used, similar effects can be obtained. Moreover, in this embodiment, germanium is introduced into the whole surface of the silicon film and the crystalline silicon film is obtained, even if germanium is selectively introduced into a part of the silicon film and the crystalline silicon film is obtained by lateral growth, similar effects can be obtained.

[Embodiment 5]

Figure 5:
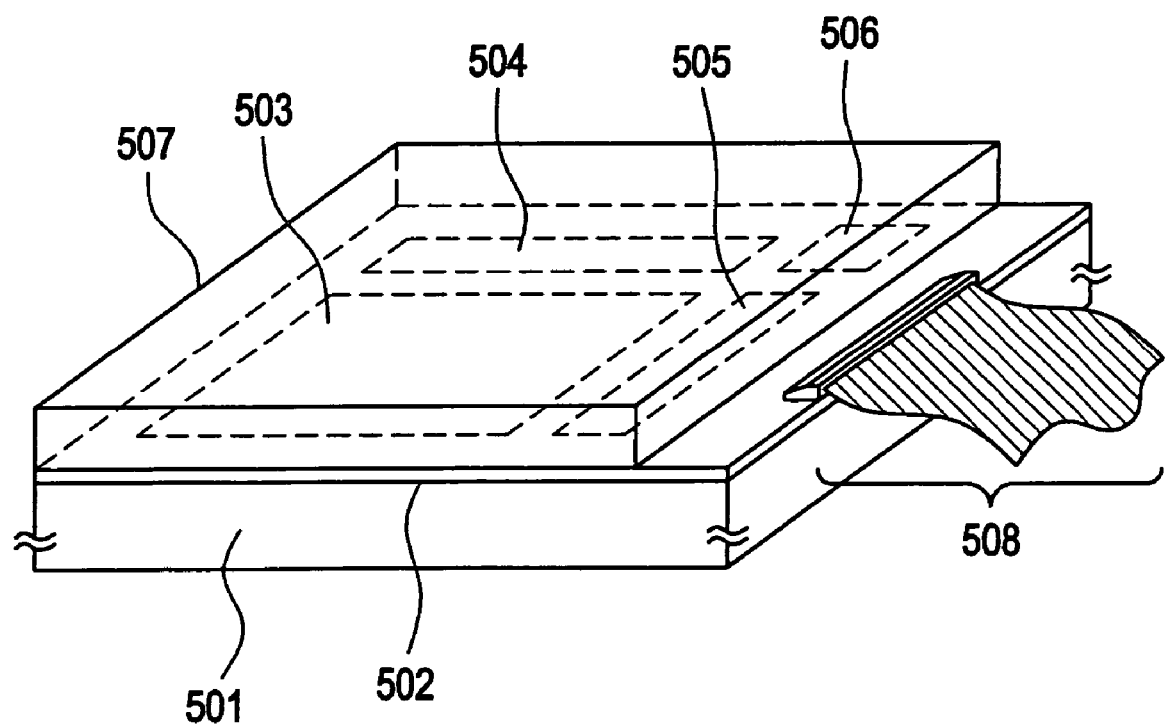
FIG. 5 is a view showing a structure of a liquid crystal module.

In FIG. 5, this embodiment shows an example in which an active matrix substrate having a structure of the embodiments 1 to 4 is used and a liquid crystal display device is constructed. FIG. 5 shows a portion corresponding to the main body of the liquid crystal display device, which is also called a liquid crystal module.

In FIG. 5, reference numeral 501 denotes a substrate (any of quartz, silicon wafer, and crystallized glass may be used), 502 denotes an insulating silicon containing film as an under film on which a plurality of TFTs are formed out of semiconductor films manufactured in accordance with the manufacturing steps of the present invention.

These TFTs constitute a pixel matrix circuit 503, a gate side driving circuit 504, a source side driving circuit 505, and a logic circuit 506 on the substrate. An opposite substrate 507 is bonded to such an active matrix substrate. A liquid crystal layer (not shown) is put between the active matrix substrate and the opposite substrate 507.

In the structure shown in FIG. 5, it is desirable that all sides of the active matrix substrate except one side are made flush with the sides of the opposite substrate. By doing so, the number of pieces obtained from a large substrate can be effectively increased.

At the one side, a part of the opposite substrate is removed to expose a part of the active matrix substrate, and an FPC (Flexible Print Circuit) 508 is attached thereto. As the need arises, an IC chip (semiconductor circuit constituted by MOSFETs formed on a single crystal silicon) may be mounted on this part.

Since the TFT having the active layer of the semiconductor thin film manufactured in the present invention has an extremely high operation speed, it is possible to integrally form a signal processing circuit driven at a high frequency of several hundreds MHz to several GHz on the same substrate as a pixel matrix circuit. That is, the liquid crystal module shown in FIG. 5 realizes a system-on-panel.

Although this embodiment shows the case where the present invention is applied to the liquid crystal display device, it is also possible to construct an active matrix type EL (electroluminescence) display device or the like. It is also possible to form an image sensor or the like provided with a photoelectric conversion layer on the same substrate.

Incidentally, like the foregoing liquid crystal display device, EL display device, or image sensor, a device having a function for converting an optical signal into an electric signal, or an electric signal into an optical signal is defined as an electrooptical device. The present invention can be applied to any electrooptical device which can be formed by using a semiconductor thin film on a substrate having an insulating surface.

[Embodiment 6]

In the present invention, it is possible to construct not only an electrooptical device as shown in the embodiment 5 but also a thin film integrated circuit (or semiconductor circuit) with an integrated functional circuits. For example, it is also possible to construct an arithmetic circuit such as a microprocessor and a high frequency circuit (MMIC: Microwave Module IC) for a portable equipment.

Further, it is also possible to construct a VLSI circuit integrated into an ultra high density state by constructing a semiconductor circuit of a three dimensional structure by actively using the merit of a TFT using a thin film. Like this, a semiconductor circuit with very rich functionality can be constructed by using the TFT of the present invention. Incidentally, in the present specification, the semiconductor circuit is defined as an electric circuit for controlling and converting electric signals by using semiconductor characteristics.

[Embodiment 7]

In this embodiment, examples of electronic equipments (applied products) incorporating electrooptical devices or semiconductor circuits shown in the embodiment 5 or embodiment 6 will be described with reference to FIGS. 6A to 6F. Incidentally, the electronic equipments are defined as products incorporating a semiconductor circuit and/or an electronic device.

As electronic equipments to which the present invention can be applied, a video camera, a still camera, a projector, a head mount display, a car navigation system, a personal computer, a portable information terminal (mobile computer, portable telephone, PHS, etc.) and the like are enumerated.

Figure 6A:
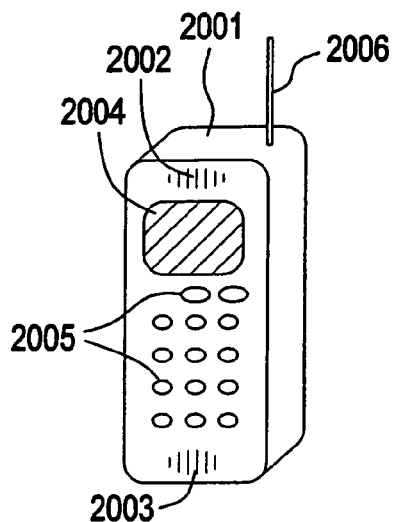
FIGS. 6A to 6F are views showing structures of electronic equipments.

FIG. 6A shows a portable telephone which is constituted by a main body 2001, an audio output portion 2002, an audio input portion 2003, a display device 2004, an operation switch 2005, and an antenna 2006. The present invention can be applied to the audio output portion 2002, the audio input portion 2003, the display device 2004, and the like.

Figure 6B:
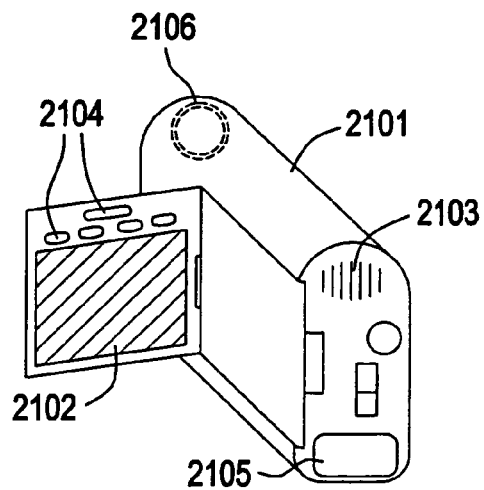

FIG. 6B shows a video camera which is constituted by a main body 2101, a display device 2102, an audio input portion 2103, an operation switch 2104, a battery 2105, and an image receiving portion 2106. The present invention can be applied to the display device 2102, the audio input portion 2103, the image receiving portion 2106, and the like.

Figure 6C:
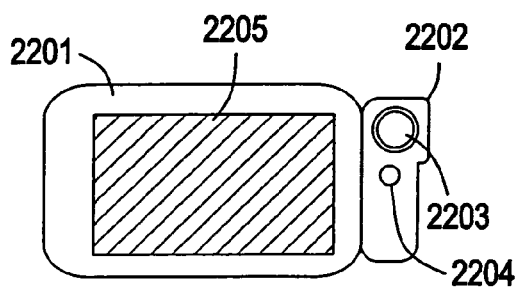

FIG. 6C shows a mobile computer which is constituted by a main body 2201, a camera portion 2202, an image receiving portion 2203, an operation switch 2204, and a display device 2205. The present invention can be applied to the camera portion 2202, the image receiving portion 2203, the display device 2205, and the like.

Figure 6D:
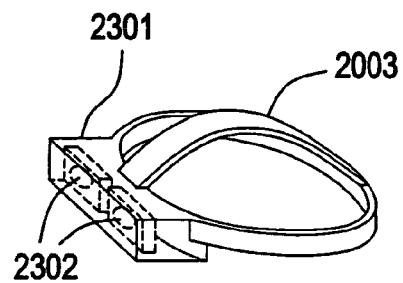

FIG. 6D shows a head mount display which is constituted by a main body 2301, a display device 2302, and a band portion 2303. The present invention can be applied to the display device 2302.

Figure 6E:
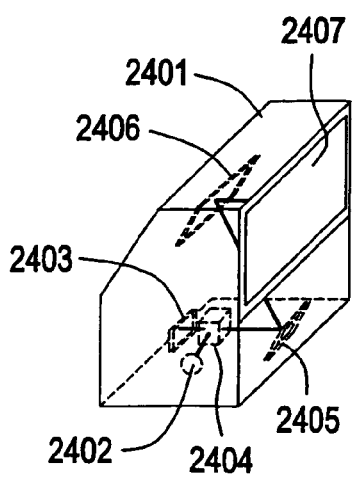

FIG. 6E shows a rear type projector which is constituted by a main body 2401, a light source 2402, a display device 2403, a polarizing beam splitter 2404, reflectors 2405 and 2406, and a screen 2407. The present invention can be applied to the display device 2403.

Figure 6F:
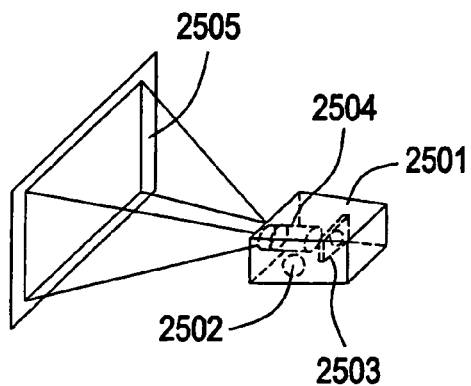

FIG. 6F shows a front type projector which is constituted by a main body 2501, a light source 2502, a display device 2503, an optical system 2504, and a screen 2505. The present invention can be applied to the display device 2503.

As described above, the scope of application of the present invention is extremely wide and the present invention can be applied to electronic equipments of any field. Moreover, the present invention can be applied to any product as long as it requires an electrooptical device or semiconductor circuit.

According to the present invention, a semiconductor device is manufactured by using a crystalline silicon film which is obtained in such a manner that a catalytic element in group 14 is introduced and crystallization is made at a low temperature for a short time, and further, irradiation of laser light or intense light is carried out. Thus, a device having excellent characteristics can be obtained with high productivity.

Like this, by using a catalytic element which does not affect the electrical characteristics of a TFT, a TFT having excellent electrical characteristics can be realized and a semiconductor device having high performance can be realized by the TFT.

What is claimed is:

1. A method of manufacturing a semiconductor device, comprising the steps of:
   forming a gate electrode over an insulating surface;
   forming a gate insulating film over the gate electrode;
   forming a semiconductor film comprising amorphous silicon over the gate insulating film;
   applying a solution comprising a catalyst for facilitating crystallization of amorphous silicon film to form a film comprising the catalyst on the semiconductor film comprising amorphous silicon;
   crystallizing the semiconductor film comprising amorphous silicon by carrying out a heat treatment;
   removing said film comprising said catalyst from a surface of the semiconductor film after the heat treatment;
   promoting crystallinity by irradiation of laser light after removing said film comprising said catalyst; and
   adding an impurity to said semiconductor film to form at least one impurity region imparting one conductivity type in said semiconductor film after promoting crystallinity by irradiation of laser light,
   wherein a kind of or plural kinds of elements selected from elements in group 14 are used as the catalyst.

2. A method of manufacturing a semiconductor device according to claim 1, wherein germanium is used as the catalyst.

3. A method of manufacturing a semiconductor device according to claim 1 wherein the solution containing a compound which contains the catalyst is at least one selected from the group consisting of germanium bromide, germanium chloride, germanium iodide, germanium oxide, germanium sulphide, germane, germane acetate, tris (2,4-pentanedionate) germanium perchlorate, tetramethylgermane, tetraethylgermane,tetraphenylgermane, and hexaethyl germanium.

4. The method according to claim 1, wherein said semiconductor device is a device selected from the group consisting of a video camera, a mobile computer, a portable telephone, a head mount display and a projector.

5. A method of manufacturing a semiconductor device, comprising the steps of:
applying a solution comprising a catalyst for facilitating crystallization of amorphous silicon film to form a film comprising the catalyst on a semiconductor film comprising amorphous silicon;
crystallizing the semiconductor film comprising amorphous silicon by carrying out a heat treatment;
removing said film comprising said catalyst from a surface of the semiconductor film after the heat treatment;
promoting crystallinity by irradiation of laser light after removing said film comprising said catalyst;
adding an impurity to said semiconductor film to form at least one impurity region imparting one conductivity type in said semiconductor film after promoting crystallinity by irradiation of laser light; and
patterning said crystallized semiconductor film into at least one semiconductor island after removing said film comprising said catalyst,
wherein a kind of or plural kinds of elements selected from elements in group 14 are used as the catalyst.

6. A method of manufacturing a semiconductor device according to claim 5, wherein germanium is used as the catalyst.

7. A method of manufacturing a semiconductor device according to claim 5 wherein the solution containing a compound which contains the catalyst is at least one selected from the group consisting of germanium bromide, germanium chloride, germanium iodide, germanium oxide, germanium sulphide, germane, germane acetate, tris (2,4-pentanedionate) germanium perchlorate, tetramethylgermane, tetraethylgermane, tetraphenylgermane, and hexaethyl germanium.

8. The method according to claim 5, wherein said semiconductor device is a device selected from the group consisting of a video camera, a mobile computer, a portable telephone, a head mount display and a projector.

9. A method of manufacturing a semiconductor device, comprising the steps of:
forming a gate electrode over an insulating surface;
forming a gate insulating film over the gate electrode;
forming a semiconductor film comprising amorphous silicon over the gate insulating film;
applying a solution comprising a catalyst for facilitating crystallization of amorphous silicon film to form a film comprising the catalyst on the semiconductor film comprising amorphous silicon;
crystallizing the semiconductor film comprising amorphous silicon by carrying out a heat treatment;
removing said film comprising said catalyst from a surface of the semiconductor film after the heat treatment;
promoting crystallinity by irradiation of intense light after removing said film comprising said catalyst; and
adding an impurity to said semiconductor film to form at least one impurity region imparting one conductivity type in said semiconductor film after promoting crystallinity by irradiation of intense light,
wherein a kind of or plural kinds of elements selected from elements in group 14 are used as the catalyst.

10. A method of manufacturing a semiconductor device according to claim 9, wherein germanium is used as the catalyst.

11. A method of manufacturing a semiconductor device according to claim 9, wherein the solution containing a compound which contains the catalyst is at least one selected from the group consisting of germanium bromide, germanium chloride, germanium iodide, germanium oxide, germanium sulphide, germane, germane acetate, tris (2,4-pentanedionate) germanium perchlorate, tetramethylgermane, tetraethylgermane, tetraphenylgermane, and hexaethyl germanium.

12. The method according to claim 9, wherein said semiconductor device is a device selected from the group consisting of a video camera, a mobile computer, a portable telephone, a head mount display and a projector.

13. A method of manufacturing a semiconductor device, comprising the steps of:
applying a solution comprising a catalyst for facilitating crystallization of amorphous silicon film to form a film comprising the catalyst on a semiconductor film comprising amorphous silicon;
crystallizing the semiconductor film comprising amorphous silicon by carrying out a heat treatment;
removing said film comprising said catalyst from a surface of the semiconductor film after the heat treatment;
promoting crystallinity by irradiation of intense light after removing said film comprising said catalyst;
adding an impurity to said semiconductor film to form at least one impurity region imparting one conductivity type in said semiconductor film after promoting crystallinity by irradiation of intense light; and
patterning said crystallized semiconductor film into at least one semiconductor island after removing said film comprising said catalyst,
wherein a kind of or plural kinds of elements selected from elements in group 14 are used as the catalyst.

14. A method of manufacturing a semiconductor device according to claim 13, wherein germanium is used as the catalyst.

15. A method of manufacturing a semiconductor device according to claim 13, wherein the solution containing a compound which contains the catalyst is at least one selected from the group consisting of germanium bromide, germanium chloride, germanium iodide, germanium oxide, germanium sulphide, germane, germane acetate, tris (2,4-pentanedionate) germanium perchlorate, tetramethylgermane, tetraethylgermane, tetraphenylgermane, and hexaethyl germanium.

16. The method according to claim 13, wherein said semiconductor device is a device selected from the group consisting of a video camera, a mobile computer, a portable telephone, a head mount display and a projector.

* * * * *